(12) United States Patent
Ji

(10) Patent No.: US 8,644,029 B1
(45) Date of Patent: *Feb. 4, 2014

(54) SURFACE MOUNT BIAS TEE

(75) Inventor: Daxiong Ji, Brooklyn, NY (US)

(73) Assignee: Scientific Components Corporation, Brooklyn, NY (US)

( * ) Notice: Subject to any disclaimer, the term of this patent is extended or adjusted under 35 U.S.C. 154(b) by 257 days.

This patent is subject to a terminal disclaimer.

(21) Appl. No.: 13/192,709

(22) Filed: Jul. 28, 2011

(51) Int. Cl.
*H05K 1/18* (2006.01)
(52) U.S. Cl.
USPC .......................................... 361/763; 361/811
(58) Field of Classification Search
USPC ................. 361/763, 782, 748, 807, 809, 811; 333/167, 12, 181, 185; 257/531
See application file for complete search history.

(56) References Cited

U.S. PATENT DOCUMENTS

| | | | |
|---|---|---|---|
| 4,821,005 A * | 4/1989 | Kling | 333/167 |
| 5,189,382 A * | 2/1993 | Kauffman | 333/169 |
| 5,414,402 A | 5/1995 | Mandai et al. | |
| 5,495,217 A | 2/1996 | Garcia | |
| 5,726,612 A | 3/1998 | Mandai et al. | |
| 5,898,344 A * | 4/1999 | Hayashi | 331/67 |
| 5,936,840 A | 8/1999 | Satwinder | |
| 5,959,846 A * | 9/1999 | Noguchi et al. | 361/782 |
| 6,509,821 B2 | 1/2003 | Oldfield | |
| 7,012,486 B2 * | 3/2006 | Ji | 333/181 |
| 7,142,086 B2 | 11/2006 | Nguyen et al. | |
| 7,868,431 B2 | 1/2011 | Feng | |
| 2002/0080002 A1 | 6/2002 | Oldfield et al. | |
| 2003/0002108 A1 * | 1/2003 | Ames et al. | 359/152 |
| 2009/0057822 A1 * | 3/2009 | Wen et al. | 257/531 |

* cited by examiner

*Primary Examiner* — Yuriy Semenenko
(74) *Attorney, Agent, or Firm* — Siegman Silber, Esq.

(57) ABSTRACT

A miniaturized wideband surface mount bias tee comprises a printed circuit board with a functioning first capacitor and a dummy second capacitor, and an inductor bonded atop the two capacitors. The capacitors, adhesive and solder are depositable by standard surface mount pick and place machinery. The inductor wires are bonded to one of the first capacitor bonding pads and to an inductor bonding pad. The circuit element bonding pads include portions bordering the pc board edges and are conductively connected to bonding pads on the bottom face of the pc board. Conductive thru-vias for the first capacitor bonding pads reduce parasitic inductance and extend the operating frequency range. A flat-topped insulating cap encloses the bias tee sides and top. The cap forms an air gap between the inductor and circuit elements and provides a surface for manipulating the bias tee with present-day assembly equipment.

21 Claims, 6 Drawing Sheets

SURFACE MOUNT BIAS TEE

BACKGROUND OF THE INVENTION

1. Field of the Invention

The present invention relates generally to a miniature wideband surface mount bias tee network for use with radio frequency (RF) and microwave frequency signals, and more particularly to a bias tee network where miniaturization has been achieved through techniques including vertical stacking of components while still permitting use with automated pick and place assembly equipment.

2. Description of the Prior Art

A bias tee circuit is used with radio frequency and microwave frequency signals to couple a direct current (DC) voltage onto a line used for alternating current (AC or RF) signals. A bias tee can also separate a combined RF and DC signal into separate RF and DC signals. Additionally, a bias tee can remove the DC component of a composite signal in order to isolate an RF component.

A bias tee generally has three ports, DC, RF and RF+DC. A low frequency or DC signal is applied to the DC port. A high frequency or RF signal is applied to the RF port. A combined signal results at the RF+DC port. The standard bias tee has an inductor functioning as an RF choke and a capacitor used for DC blocking. Generally, the inductor is wire wound on a ferrite core. The inductor has one end connected to the DC port and another end connected to an internal node. The internal node joins the DC blocking capacitor with the RF+DC port. The other end of the capacitor is connected to the RF port.

U.S. Pat. No. 7,012,486 entitled MINIATURE WIDEBAND BIAS TEE teaches a miniature wideband bias tee having a small package size. The bias tee has a low temperature co-fired ceramic (LTCC) substrate composed of multiple layers, each with circuit features. A first inductor is located within the substrate. A second inductor is attached to the top surface and has a core with a wire wound on the core. The second inductor serves to increase the usable frequency bandwidth of the bias tee. Terminals are located on the top and bottom surfaces of the LTCC substrate. Ends of the second inductor core wire are connected to terminals on the top surface. A capacitor is mounted to terminals on the top surface. Several vias extend through the substrate and electrically connect the terminals to the inductor and capacitor. This bias tee provides a small package, but the frequency response is limited to a range of 50 MHz to 6 GHz. Further, manufacturing this bias tee requires multiple layers of LTCC to be custom made, assembled and then fused, which requires very specialized manufacturing equipment. Additionally, a second inductor is required, further increasing part and assembly cost. A major challenge is to vertically stack components without incurring excessive cost.

Another method of producing an inductor which is vertically stacked to avoid requiring additional horizontal space is taught by U.S. Pat. No. 7,868,431 entitled COMPACT POWER SEMICONDUCTOR PACKAGE AND METHOD WITH STACKED INDUCTOR AND INTEGRATED CIRCUIT DIE. Herein, a miniature inductor is made with an inductor core disposed on or in a substrate, and a combination of several half-coil forming conductive elements disposed beneath the inductor core and several half-coil forming conductive elements typically made of bond wires disposed atop the inductor core. The upper half-coil forming elements are conductively connected to respective lower half-coil fanning elements to jointly form an inductive coil enclosing the inductive core. While this method of forming a stacked inductor does save on horizontal real estate, there are numerous specialized manufacturing steps needed to form elements within the substrate, and numerous wirebonding operations needed as well. Additionally, the circuit must be fully encapsulated to protect it from the environment and to permit handling.

U.S. Pat. No. 5,936,840 entitled STACKED PASSIVE COMPONENTS teaches an edge-mounting method of using vertical space to save on horizontal space. Rectangular components such as surface mount resistors and capacitors are stacked on end with insulating spacers therebetween. The existing end terminals of each surface mount component provide many of the electrical contacts needed as well as solderable mounting points for mechanically joining the resulting module to a printed circuit board, and conductive pathways are formed in secondary operations along the resulting module's other faces as necessary for electrical circuit interconnections. However, this stacking methodology lends itself best to uniformly sized rectangular components, but poorly to the sort of wound coil inductors best suited for high frequency signals. Further, specialized tooling and machinery is needed to assemble the multiple layer stack and to form the conductive pathways along the module's faces.

A more cost-effective miniaturized bias tee providing wide-band high frequency performance would be fabricated on an inexpensive and readily available substrate such as pc board material, have circuit elements that are readily available or simply manufactured, require only simple and cost-effective assembly operations, and be surface mountable with standard automated pick-and-place surface mount assembly equipment.

SUMMARY

A more cost-effective and better performing surface mount bias tee comprises a printed circuit (pc) board having two pairs of body bonding pads, wherein a first body is bonded to a pair of first body bonding pads and a second body is bonded to a pair of second body bonding pads. The first body is a first capacitor with a pair of end terminals, wherein the pair of first end terminals are conductively bonded to the pair of first body bonding pads. The second body is dimensioned for interchangeability with the first body and has a pair of second end terminals, wherein the pair of second end terminals are bonded to the pair of second body bonding pads. The second body is disposed approximately aligned with and parallel to the first capacitor. An inductor with a first end, a second end and an inductor body with a wire coil wound thereon has the first end disposed atop the first body and the second end disposed atop the second body, wherein the inductor body is transversely suspended atop and therebetween the first body and the second body. The wire coil has a first wire end and a second wire end, the first wire end being conductively bonded to one of the pair of first body bonding pads and the second wire end being conductively bonded to the inductor bonding pad. According to another aspect of the present invention, the second body is a second capacitor which is a non-circuit component functioning as a spacer for positioning the inductor. According to yet another aspect of the present invention, the two first body bonding pads and the inductor bonding pad, plus an open pad, are disposed along the edges of the pc board and connected to four bonding pads on the bottom face of the pc board by conductive material along the edges of the pc board. Additionally, conductive vias through the pc board for the two first body bonding pads and the aligned bottom bonding pads serve to reduce parasitic inductance and extend the operating frequency range of the bias tee. A fifth bonding pad on the bottom face of the pc board serves to provide increased mechanical retention and optionally acts as a grounding contact. According to still another aspect of the present invention, an insulating cap with a flat top encloses the sides and top of the bias tee, providing an air gap between the inductor and nearby circuit elements, and providing a surface for holding and moving the bias tee via surface mount pick and place machinery.

OBJECTS AND FEATURES OF THE INVENTION

It is an object of the present invention to provide a surface mountable miniature bias tee usable with automated pick and place surface mount machinery.

It is another object of the present invention to provide a miniature bias tee that, except for inductor placement, is manufacturable with automated pick and place surface mount machinery.

It is yet another object of the present invention to provide a miniature bias tee that provides a flat frequency performance, free from resonance, over a range of at least 10 MHz to 10 GHz from −40 degrees Celsius to 85 degrees Celsius.

It is a feature of the present invention to use printed circuit board material as a substrate for the bias tee.

It is another feature of the present invention to have a wound-coil inductor disposed atop a pair of surface mount bodies.

It is yet another feature of the present invention to have an insulating cap serving to provide an air gap between the inductor and external electronic components.

It is yet another feature of the present invention to have an insulating cap with a flat top surface serving to provide a surface for manipulating by automated pick and place machinery for use in circuit assembly.

BRIEF DESCRIPTION OF THE DRAWINGS

The present version of the invention will be more fully understood with reference to the following Detailed Description in conjunction with the drawings of which.

DESCRIPTION OF THE PREFERRED EMBODIMENTS

Figure 1A:
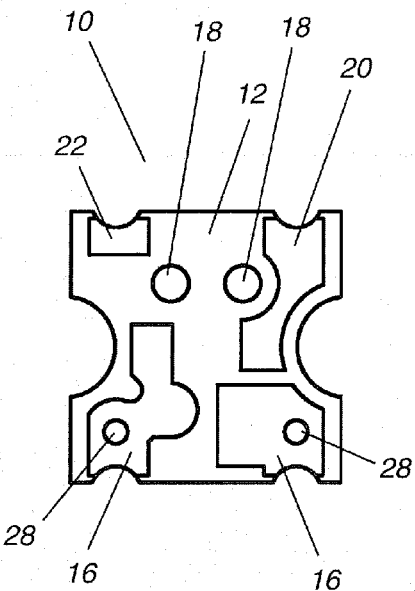
FIG. 1a is a plan view of the top face of a printed circuit board.
Figure 1B:
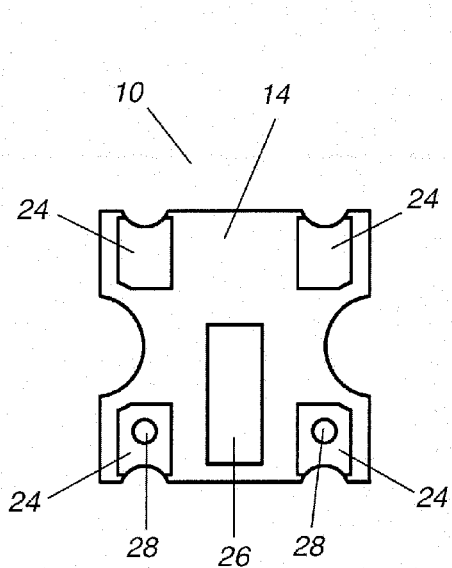
FIG. 1b is a plan view of the bottom face of a printed circuit board.

As shown in FIGS. 1a and 1b, a printed circuit board 10 has component bonding pads on a top face 12. These pads are used to bond several components or bodies, which for the first component or body is a capacitor and for the second component or body may be a spacer element designed for interchangeability with the first body, or may be a second capacitor which in this circumstance is a noncircuit element functioning as a spacer. The component bonding pads include a pair of first body bonding pads 16, a pair of second body bonding pads 18, an inductor bonding pad 20, and an open bonding pad 22. The bottom face 14 has four bottom bonding pads 24 and a bonding pad which is preferably treated as a ground pad 26. Four notches with edge metallization 30 provide conductive signal paths between the bonding pads on the top face 12 and the bonding pads on the bottom face 14. The notches are a preferred feature serving to reduce the chances of the component tombstoning (tipping on end) during reflow soldering. A pair of conductive vias 28 disposed throughbetween the first body bonding pads 16 and the aligned bottom bonding pads 24 serve to reduce parasitic inductance from the edge metallization, thus permitting improved high frequency signal performance. The printed circuit board 10 may be economically manufactured as multiples in panel form, and singulated either before or after component attachment.

Figure 2A:
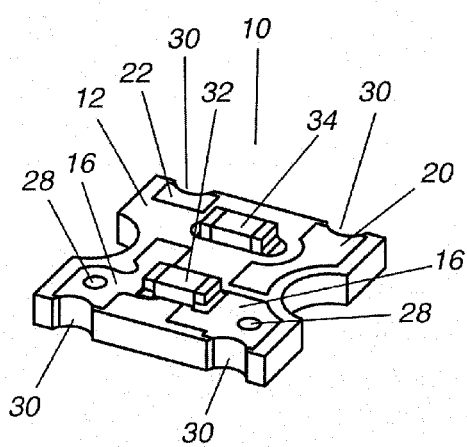
FIG. 2a is an isometric view of a printed circuit board with two surface mount bodies mounted thereon.

FIG. 2a shows a first capacitor 32 attached to the first body bonding pads 16 and a second body or second capacitor 34 attached to the second body bonding pads 18, preferably in line and parallel with each other. The typical attachment means is solder paste, screened onto portions of the pc board and melted in a reflow oven. This provides a strong and electrically conductive bond. In some assembly circumstances, an adhesive, preferably of the chipbonding type, will be used to further mechanically attach the components to the printed circuit board prior to reflow soldering. The second body or second capacitor 34 is a dummy element preferably approximately identical in size to the first capacitor 32 and is used solely for mechanical support, and the second body bonding pads 18 are preferably not connected to any circuitry.

Figure 2B:
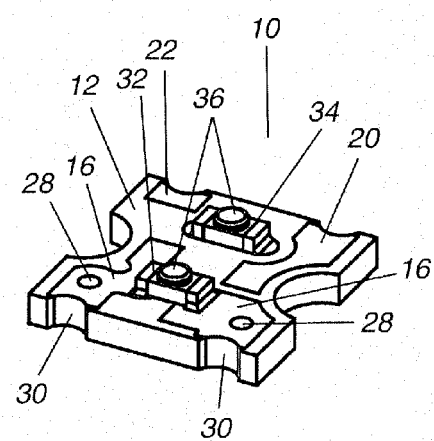
FIG. 2b is another isometric view of a printed circuit board with two surface mount bodies mounted thereon and adhesive dots atop the capacitors.
Figure 3:
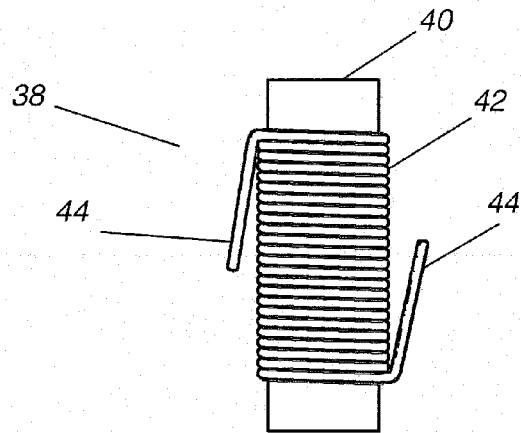
FIG. 3 is a plan view of a wound coil inductor.
Figure 4:
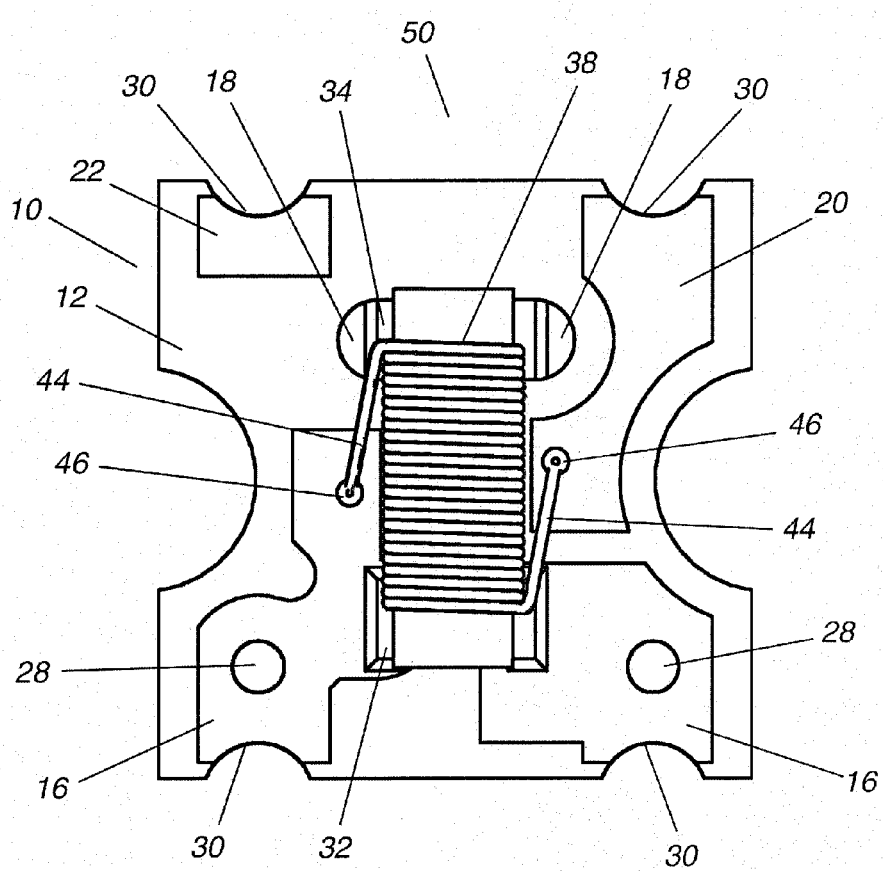
FIG. 4 is a plan view of a bias tee assembly.
Figure 5:
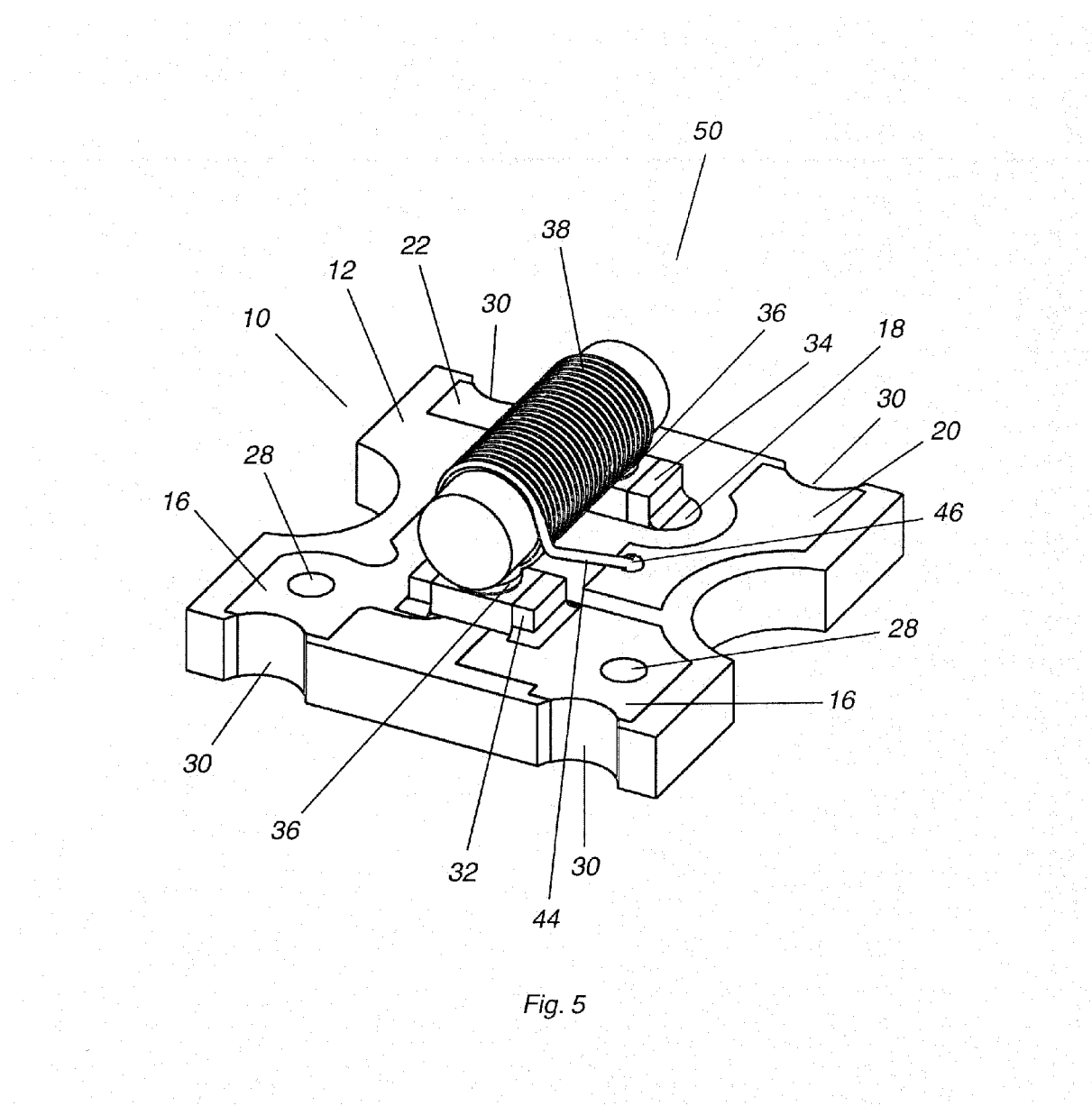
FIG. 5 is an isometric view of a bias tee assembly.

FIG. 3 shows the wound coil inductor 38 which is composed of a core 40 and wire coil 42 including wire ends 44. Preferably the wire coil 42 is composed of 23.5 turns of a 42 gauge insulated wire. In assembly of the bias tee 50, the wound coil inductor 38 can be viewed as having a first end, a second end and an inductor body, wherein the first end and second end respectively are positioned atop the first capacitor 32 and the second body or second capacitor 34 respectively and the inductor body is suspended transversely therebetween, as shown in FIGS. 4 and 5. The first and second ends may be pressed into dots of adhesive 36 which have been deposited atop the first capacitor 32 and the second body or second capacitor 34. FIG. 2b shows dots of adhesive 36, preferably of the chipbonding type, dispensed onto the tops of the first capacitor 32 and second body or second capacitor 34. Standard automated surface mount adhesive deposition machinery is the preferred method for accomplishing this operation. Some curing time is generally needed for the adhesive 36. The wire ends 44 are welded to one of the first body bonding pads 16 and to the inductor pad 20. The welds 46 are a preferred high precision means of conductively attaching the wire ends 44, and an easily accomplished step in manufacturing.

Figure 6:
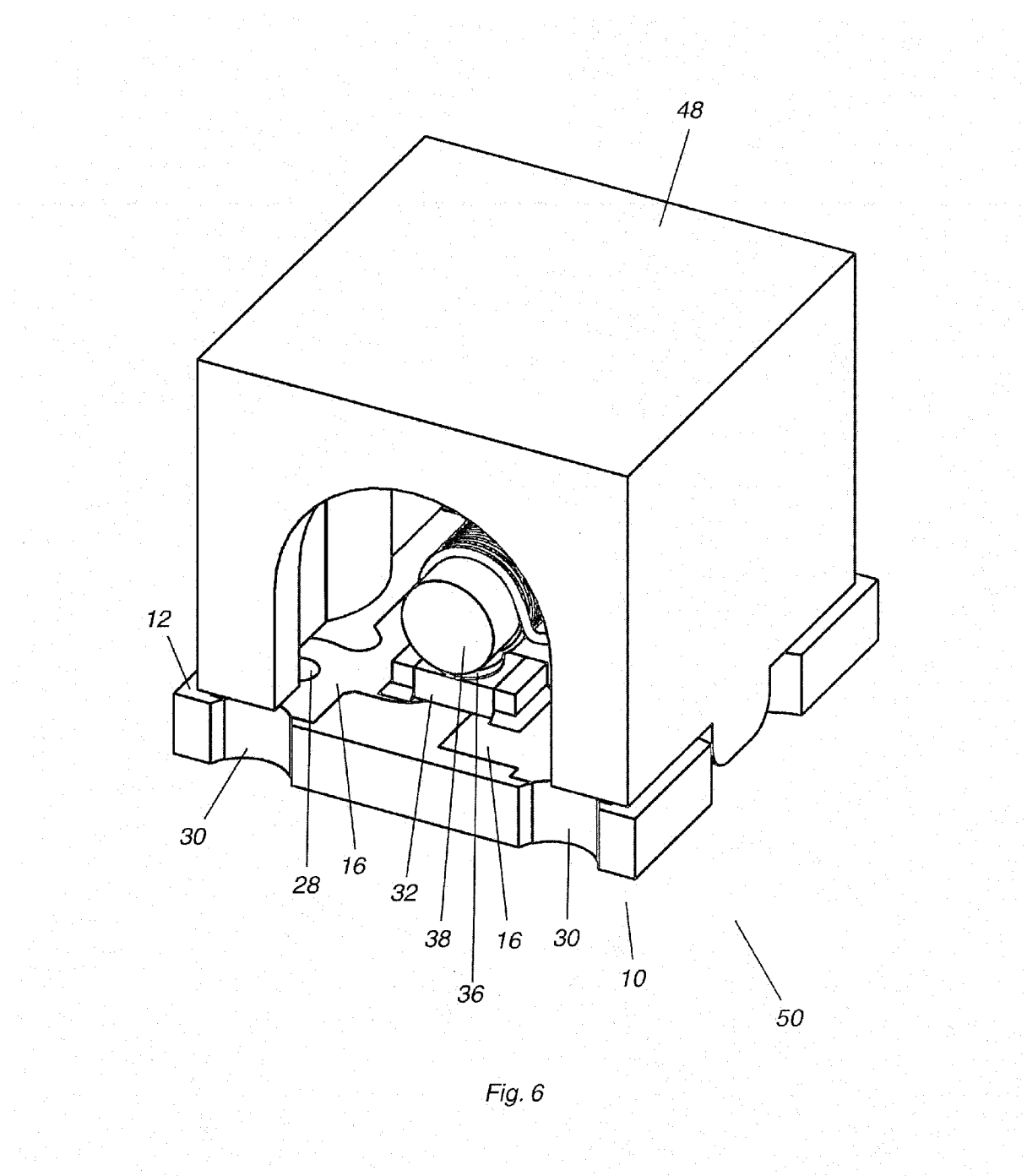
FIG. 6 is an isometric view of a bias tee assembly including an insulating cap.

FIG. 6 shows a cap 48 attached to the printed circuit board 10 to complete the assembly of the bias tee 50. The cap 48 is preferably manufactured by injection molding from a durable and insulating plastic material and serves to provide an insulated air gap between the wound coil inductor 38 and any nearby electronic components or other electrically conductive objects. Additionally, the cap 48 includes a flat top surface for use by automated pick and place machinery. Such machinery generally utilizes a miniature vacuum nozzle to hold and lift components with flat top surfaces, and the flat top surface of the cap 48 is designed to work with standard pick and place machinery.

The bias tee 50 is preferably assembled in the following manner:

1. The printed circuit board 10 is manufactured by a combination of standard etching, drilling, routing and plating processes. In some circumstances, sawing and punching operations may also be employed.

2. Solder paste is selectively screened onto portions of the first body pads 16 and the second body pads 18.

3. The first capacitor 32 is placed on the first body pads 16, the second body or second capacitor 34 is placed on the second body pads 18, and the first capacitor 32 and the second body or second capacitor 34 are reflow soldered in place.

4. The core 40 is wound with wire 42 to form the wound coil inductor 38 with wire ends 44.

5. Adhesive 36 is dispensed atop the first capacitor 32 and the second body or second capacitor 34.

6. The wound coil inductor 38 is placed onto the adhesive 36 and cured.

7. The wire ends 44 are welded to one of the first capacitor bonding pads 16 and the inductor bonding pad 20.

8. The cap 48 is attached to the printed circuit board 10.

9. The fully assembled bias tee 50 is electrically tested.

The assembled bias tee 50 measures approximately 0.150 inches by 0.150 inches by 0.140 inches tall. In use, the bias tee 50 is typically mounted to a printed circuit board (not shown) along with other electronic components. The bottom bonding pads 24 and the ground pad 26 are attached to the printed circuit board with a reflow solder paste, which is typically screen printed onto the printed circuit board. A reflow oven is used to melt the solder paste and solder the bias tee 50 and other electronic components to the printed circuit board. Note that the cap 48 must be made of a material capable of withstanding the heat of the reflow oven without becoming damaged or deformed.

Figure 7:
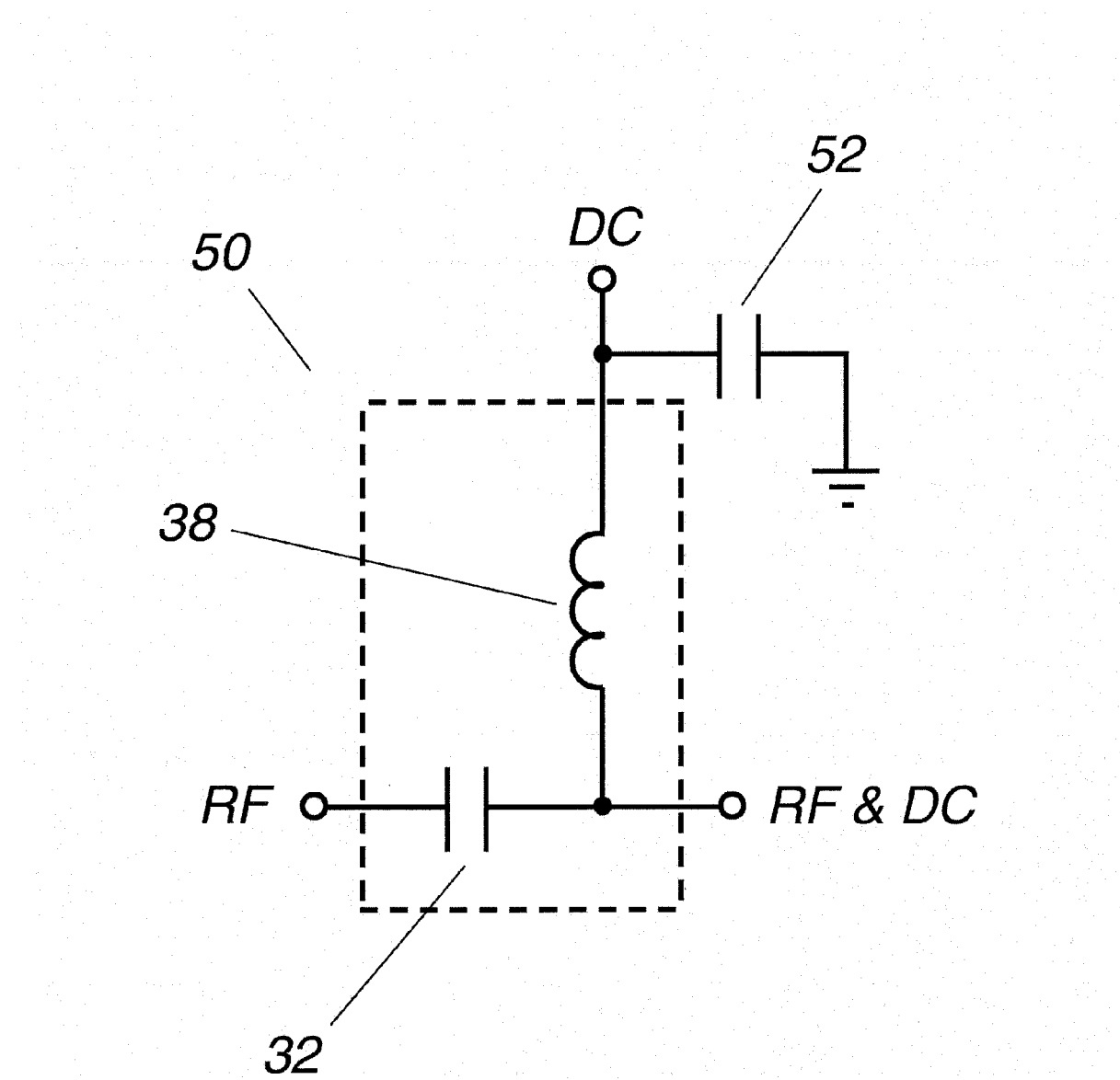
FIG. 7 is an electrical schematic diagram of a test circuit for a bias tee.

A bias tee in accordance with the present invention was built and tested for electrical performance at 0 mA current and 200 mA (DC) current, and is capable of handling up to 1 Watt of RF power. In the circuit of FIG. 7, the bias tee 50 has three ports, DC, RF and RF+DC. A low frequency or DC signal is applied to the DC port. A high frequency or RF signal is applied to the RF port. A combined signal results at the RF+DC port. The first capacitor 32 has a capacitance of approximately 1000 pF and the inductor 38 has an inductance value of approximately 1820 nH. The external capacitor 52 has a value of 0.010 uF.

Figure 8A:
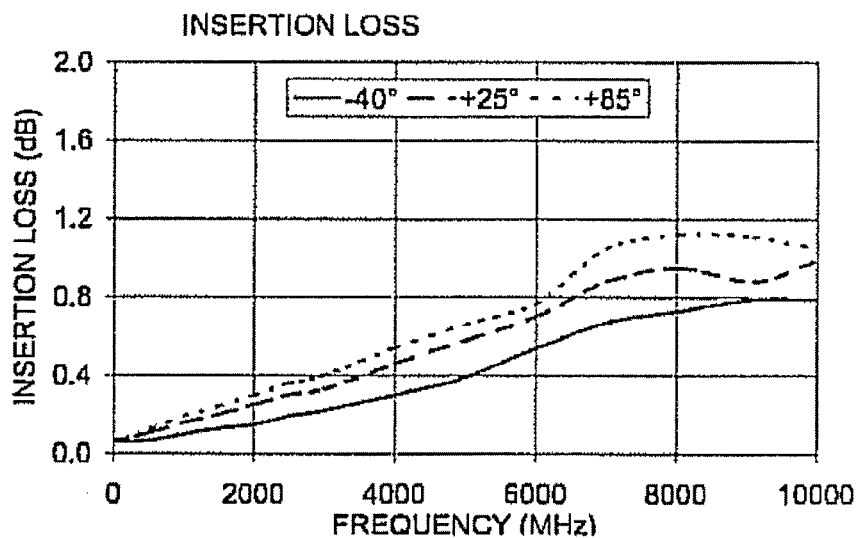
FIG. 8a is graph showing insertion loss versus frequency at different temperatures for the bias tee of the present invention.
Figure 8B:
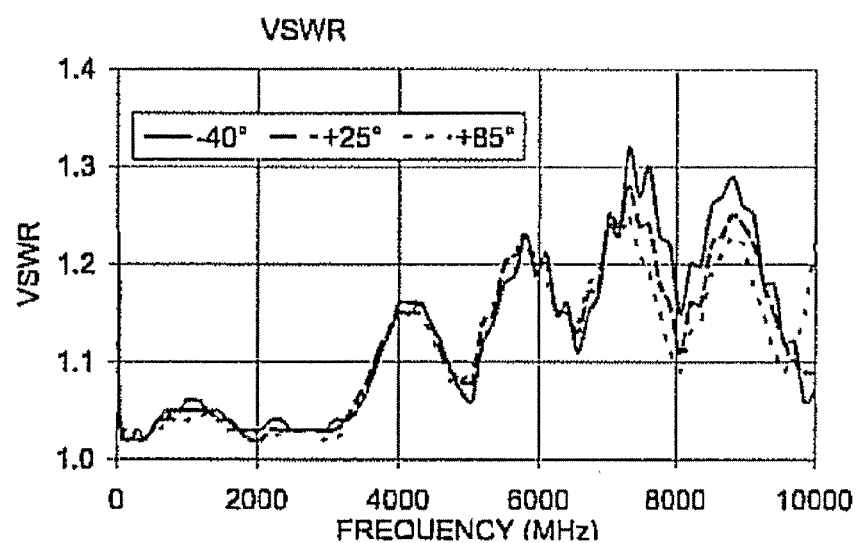
FIG. 8b is a graph showing VSWR versus frequency at different temperatures for the bias tee of the present invention.

As shown in the Insertion Loss graph of FIG. 8a and the VSWR graph of FIG. 8b, the bias tee of the present invention can operate over a frequency range of 10 MHz to 10 GHz, for temperatures between −40 degrees Celsius and 85 degrees Celsius. The Insertion Loss is typically between 0.1 and 0.8 with a maximum of 1.6, and the VSWR is typically between 1 and 1.3 with a maximum of 1.5.

An alternate embodiment of the bias tee uses a base material other than fiberglass printed circuit board, where material options include LTCC as well as any other durable planar insulating material having conductive bonding pads and conductive traces on surfaces and optionally conductive traces within.

Another alternate embodiment of the bias tee has no bonding pads for the second body or second capacitor and merely uses an adhesive to attach the second body or second capacitor in place.

Yet another alternate embodiment of the bias tee uses conductive means other than solder, for example conductive epoxy, to make electrical contact between the first capacitor and the first capacitor bonding pads.

Still another alternate embodiment of the bias tee has the inductor solely disposed atop the first capacitor, and no second body or capacitor is needed.

Having described herein illustrative embodiments and best mode of the present invention, persons of ordinary skill in the art will appreciate various other features and advantages of the invention apart from those specifically described above. It should therefore be understood that the foregoing is only illustrative of the principles of the invention, and that various modifications and additions can be made by those skilled in the art without departing from the spirit and scope of the invention. Accordingly, the appended claims shall not be limited by the particular features that have been shown and described, but shall be construed also to cover any obvious modifications and equivalents thereof.

What is claimed is:

1. A surface mount bias tee comprising:
   a printed circuit board having a top face, a bottom face and a body;
   said top face having a pair of first body bonding pads, a pair of second body bonding pads, and an inductor bonding pad;
       said second body bonding pads being electrically isolated from other conductive elements on said printed circuit board;
   a first body being a first capacitor with a pair of end terminals, said pair of first end terminals of said first capacitor being conductively bonded to said pair of first body bonding pads;
   a second body being dimensioned for interchangeability with said first body with a pair of end terminals, said pair of second end terminals of said second body being bonded to said pair of second body bonding pads;
   said second body being disposed approximately aligned with and parallel to said first body of said first capacitor;
   an adhesive placed atop said first body and said second body;
   an inductor with a first end, a second end and an inductor body, said first end disposed atop and mechanically joined via said adhesive with said first body and said second end disposed atop and mechanically joined via said adhesive with said second body, whereby said inductor body is transversely suspended atop and therebetween said first body and said second body;
   said inductor body having a wire coil wound thereon; and,
   said wire coil having a first wire end and a second wire end, said first wire end being conductively bonded to one of said pair of first body bonding pads and said second wire end being bonded to said inductor bonding pad.

2. The surface mount bias tee as described in claim 1, wherein said second body is a second capacitor and is a noncircuit component functioning as a spacer for positioning said inductor.

3. The surface mount bias tee as described in claim 1, wherein said bottom face has at least a first edge pad, a second edge pad, and a third edge pad;
   said first edge pad aligned with at least a portion of one of said first body bonding pads;
   said second edge pad aligned with at least a portion of the other of said first body bonding pads;
   said third edge pad aligned with at least a portion of said inductor bonding pad; and, each pair of said edge pad and said aligned bonding pad having a conductive pathway therebetween.

4. The surface mount bias tee as described in claim 3, wherein said conductive pathways are formed in notches along the edge of said printed circuit board body.

5. The surface mount bias tee as described in claim 4, further comprising:
an open pad on said top face;
a fourth edge pad on said bottom face, said fourth edge pad being aligned with at least a portion of said open pad; and,
said open pad and said fourth edge pad having a conductive pathway therebetween in a notch along the edge of said printed circuit board body.

6. The surface mount bias tee as described in claim 3, wherein each pair of said first body bonding pads and said aligned edge pads have conductive vias therebetween through said body of said printed circuit board, thereby reducing the inductance effect of said conductive pathways in conductive communication with said first capacitor and increasing the usable frequency range of said surface mount bias tee.

7. The surface mount bias tee as described in claim 1, further comprising:
an insulating cap having horizontally disposed insulating top and at least one vertically disposed insulating side wall;
said insulating top disposed above said inductor thereby providing an insulated gap between said inductor and any external objects; and,
a portion of said insulating side wall being mechanically joined to said printed circuit board, thereby forming in combination with said printed circuit board a surface mountable package usable by ordinary surface mount pick and place machinery.

8. The surface mount bias tee as described in claim 7, wherein said insulating cap is formed from a polymer material capable of withstanding reflow soldering oven temperatures.

9. The surface mount bias tee as described in claim 1, wherein said adhesive is a chipbonding adhesive.

10. The surface mount bias tee as described in claim 1, wherein said first and second wire ends are welded to said conductive pads.

11. The surface mount bias tee of claim 1, wherein the value of said first capacitor is approximately 1000 picofarads.

12. The surface mount bias tee of claim 1, wherein the value of said inductor is approximately 1820 nanohenries.

13. The surface mount bias tee of claim 1, wherein said bottom face includes a separate pad usable as a ground pad.

14. The surface mount bias tee of claim 1, wherein said printed circuit board is 0.020 inches thick.

15. The surface mount bias tee of claim 1, wherein the frequency response range is at least 10 MHz to 10 GHz.

16. The surface mount bias tee of claim 1, wherein a planar insulating material with conductive bonding pads and conductive traces thereon is used, other than fiberglass bodied printed circuit board material.

17. The surface mount bias tee of claim 1, wherein said second body is adhesively bonded directly to said printed circuit board and no second body bonding pads are used.

18. The surface mount bias tee of claim 1, wherein said first body and said second body end terminals are conductively bonded to said bonding pads by solder.

19. The surface mount bias tee of claim 1, wherein said first body and said second body end terminals are conductively bonded to said bonding pads by conductive adhesive.

20. A surface mount bias tee comprising:
a printed circuit board having a top face, a bottom face and a body;
said top face having a pair of first body bonding pads, a pair of second body bonding pads being not connected to other conductive elements, an inductor bonding pad and an open bonding pad;
said bottom face having a first edge pad, a second edge pad, a third edge pad, a fourth edge pad and a ground pad;
said first edge pad aligned with at least a portion of one of said first body bonding pads;
said second edge pad aligned with at least a portion of the other of said first body bonding pads;
said third edge pad aligned with at least a portion of said inductor bonding pad;
said fourth edge pad aligned with at least a portion of said open bonding pad;
each pair of said edge pad and said aligned bonding pad having a conductive pathway therebetween in notches along the edge of said printed circuit board body;
a first body being a first capacitor with a pair of end terminals, said pair of first end terminals of said first capacitor being conductively bonded to said pair of first body bonding pads;
a second body being dimensioned for interchangeability with said first body with a pair of end terminals, said pair of second end terminals of said second body being bonded to said pair of second body bonding pads;
said second body being disposed approximately in line with and parallel to said first body of said first capacitor;
each pair of said first body bonding pads and said aligned edge pads having conductive vias therebetween through said body of said printed circuit board, thereby reducing the inductance effect of the conductive pathways in conductive communication with said first capacitor and increasing the usable frequency range of said surface mount bias tee;
an inductor with a first end, a second end and an inductor body, said first end disposed atop said first body and said second end disposed atop said second body, whereby said inductor body is transversely suspended atop and therebetween said first body and said second body;
a chipbonding adhesive interposed therebetween said inductor and said first body and said inductor and second body as a means for mechanical attachment;
said inductor body having a wire coil wound thereon;
said wire coil having a first wire end and a second wire end, said first wire end being welded to one of said first capacitor bonding pads and said second wire end being welded to said inductor bonding pad;
an insulating cap having horizontally disposed insulating top and at least one vertically disposed insulating side wall;
said insulating top disposed above said inductor thereby providing an insulated gap between said inductor and any external objects; and,
a portion of said insulating side wall being mechanically joined to said printed circuit board, thereby forming in combination with said printed circuit board a surface mountable package usable by ordinary surface mount pick and place machinery.

21. A method of assembling a surface mount bias tee, comprising the steps of:
  (1) manufacturing a printed circuit board having at least a pair of first body bonding pads, a pair of second body bonding pads, and an inductor bonding pad;
  (2) depositing a solder paste on said pairs of first and second body bonding pads;
  (3) placing a first body comprising a first capacitor on said first body bonding pads;
  (4) placing a second body on said second body bonding pads;
  (5) reflow soldering said first body and said second body in place;
  (6) winding an inductor core with insulated wire to produce a wound coil inductor having two wire ends;
  (7) dispensing an adhesive atop said first body and said second body;
  (8) bonding said wound coil inductor atop and transversely across said first body and said second body by means of said adhesive;
  (9) welding one of said wire ends to one of said first body bonding pads;
  (10) welding the other of said wire ends to said inductor bonding pad;
  (11) attaching an insulating cap to said printed circuit board such that said first body and said second body and said wound coil inductor are contained within said cap; and,
  (12) performing electrical tests upon said surface mount bias tee.

* * * * *